US005414916A

United States Patent [19]

Hayes

[11] Patent Number: 5,414,916

[45] Date of Patent: May 16, 1995

[54] INK JET PRINTHEAD ASSEMBLY HAVING ALIGNED DUAL INTERNAL CHANNEL ARRAYS

[75] Inventor: Donald J. Hayes, Plano, Tex.

[73] Assignee: Compaq Computer Corporation, Houston, Tex.

[21] Appl. No.: 66,390

[22] Filed: May 20, 1993

[51] Int. Cl.$^6$ .................................. H01L 41/22

[52] U.S. Cl. .................................. 29/25.35; 29/890.1

[58] Field of Search .................................. 29/25.35, 890.1; 346/140 R; 310/333

[56] References Cited

PUBLICATIONS

EP, A, O 484 983 -May 13, 1992.

Patent Abstracts of Japan vol. 16, No. 521 (E-128-5)-Oct. 27, 1992.

Patent Abstracts of Japan vol. 16, No. 444 (E-126-5)-Sep. 16, 1992.

*Primary Examiner*—Carl E. Hall

*Attorney, Agent, or Firm*—Konneker Bush Hitt & Chwang

[57] ABSTRACT

A high density ink jet printhead is fabricated by first forming a body subassembly comprising a piezoelectric main block having metallic layers disposed on opposite first and second sides thereof, and piezoelectric sheets secured to front portions of the metallic layers. Using a precision dicing saw, a first spaced series of parallel grooves, longitudinally extending between the front and rear ends of the subassembly, are cut into the first side of the subassembly. The subassembly is then placed, groove side down, in a support fixture having mirrors secured thereto and positioned adjacent the opposite ends of the grooves. Reflections of opposite groove ends in the mirrors are then used as line-of-sight guides to position the saw which is then used to form a second series of grooves in the second subassembly side which are in precise lateral alignment with the first series of grooves. Covering blocks are then secured to the opposite piezoelectric sheets over the open outer sides of the grooves and form therewith interior ink receiving channels bounded along their lengths by piezoelectrically deflectable side wall segments of the printhead body. The rear ends of the channels are sealed off, ink supply conduits are communicated with rear end portions of the channels, and a plate member having first and second spaced series of ink discharge orifices respectively communicated with the front ends of the first and second series of interior channels is secured over the front end of the printhead body.

6 Claims, 2 Drawing Sheets

INK JET PRINTHEAD ASSEMBLY HAVING ALIGNED DUAL INTERNAL CHANNEL ARRAYS

BACKGROUND OF THE INVENTION

1. Field of the Invention

The present invention relates generally to ink jet printing apparatus, and more particularly relates to the fabrication of piezoelectrically operable ink jet printhead assemblies.

2. Description of Related Art

A piezoelectrically actuated ink jet printhead is a device used to selectively eject tiny ink droplets onto a print medium sheet operatively fed through a printer, in which the printhead is incorporated, to thereby form from the ejected ink droplets selected text and/or graphics on the sheet. In one representative configuration thereof, an ink jet printhead has, within its body portion, a single internal array of horizontally spaced, mutually parallel ink receiving channels. These internal channels are covered at their front ends by a plate member through which a spaced series of small ink discharge orifices are formed. Each channel opens outwardly through a different one of the spaced orifices.

A spaced series of internal piezoelectric wall portions of the printhead body (typically formed from a piezoceramic material referred to as "PZT") separate and laterally bound the channels along their lengths. To eject an ink droplet through a selected one of the discharge orifices, the two printhead sidewall portions that laterally bound the channel associated with the selected orifice are piezoelectrically deflected into the channel and then returned to their normal undeflected positions. The driven inward deflection of the opposite channel wall portions increases the pressure of the ink within the channel sufficiently to force a small quantity of ink, in droplet form, outwardly through the discharge orifice.

A conventional method of fabricating an ink jet printhead of this type has been to provide a rectangular block of piezoceramic material, such as the previously mentioned PZT material, position a thin layer of metallic material on a side surface of the block, and then form a spaced series of parallel grooves through the metallic layer and into the underlying side of the piezoceramic block.

After these grooves are formed (using, for example a precision dicing saw) a covering block of piezoceramic material is appropriately secured to the outer side of a front portion of the metallic layer to thereby cover the open sides of front portions of the grooves and convert them to the interior body channels which will ultimately be supplied with ink. The open rear ends of the channels are appropriately sealed off, and the orifice plate is secured to the front end of the resulting printhead body over the open front ends of the channels.

Behind the covering block portion of the printhead body the spaced apart, parallel portions of the metallic layer are used as electrical leads for transmitting piezoelectric driving signals, from an appropriate controller device, to the interior piezoceramic side walls that laterally bound the ink-filled channels along their lengths to laterally deflect such side walls and thereby create the desired ink droplet discharge through the printhead orifice plate.

While this conventional ink jet printhead fabrication method, with its single array of internal body grooves, provides a precisely spaced multiplicity of interior ink channels and associated ink discharge orifices, there is, of course, a physical limit with respect to the total number of ink discharge orifices per inch that may be produced in a given printhead body using such method.

In cases where it is desired to increase the total number of ink discharge orifices per inch beyond this physical limit, for example to double the number of orifices per inch, it has heretofore been necessary to "stack" two printhead bodies against one another, thereby undesirably doubling both the overall size of the printhead body and the total number of components needed to fabricate it.

It can readily be seen that it would be highly desirable to provide a method of fabricating an ink jet printhead, of the general type described above, in which the discharge orifice density (i.e., the number of ink discharge orifices per inch) is doubled without correspondingly doubling the size of the printhead or the total number of components needed to fabricate it. It is accordingly an object of the present invention to provide such an ink jet printhead fabrication method.

SUMMARY OF THE INVENTION

In carrying out principles of the present invention, in accordance with a preferred embodiment thereof, a high discharge orifice density ink jet printhead is fabricated by first forming a printhead body subassembly comprising a first piezoelectrically deflectable block structure having first and second opposite sides and a front end, first and second layers of a metallic material respectively disposed on the first and second block structure sides, and first and second sheets of a piezoelectrically deflectable material respectively secured to front end portions of the outer sides of the first and second metallic layers. The first block structure is preferably a unitary block structure.

First and second spaced series of elongated, parallel exterior surface grooves are then respectively formed on the first and second sides of the first block structure. The grooves laterally extend into the first and second block structure sides, through the piezoelectric sheets and their associated metallic layers, and have open outer sides and front ends.

Second and third piezoelectric blocks are respectively secured to the outer sides of the first and second piezoelectric sheets, cover the outer sides of the grooves, and form with the grooves first and second series of ink receiving channels disposed within the body of the printhead and are laterally bounded along their lengths, on opposite sides thereof, by first and second series of piezoelectrically deflectable side wall segments of the subassembly.

A plate member is secured to the front end of the printhead body, over the front ends of the first and second series of ink receiving channels, and has a first spaced series of ink discharge orifices formed therein and operatively communicated with the front ends of the first series of ink receiving channels, and a second spaced series of ink discharge orifices formed therein and operatively communicated with the front ends of the second series of ink receiving channels.

Rear ends of the ink receiving channels are appropriately sealed off, and means are provided for flowing ink into the first and second series of ink receiving channels. The segments of the metallic layers remaining after the grooves are formed therethrough are used as electrical leads through which driving signals may be transmitted to the channel side wall sections to piezoelectrically deflect selected opposing pairs thereof in a manner discharging ink from the channel which they laterally bound through the discharge orifice associated with such channel.

According to a key feature of the present invention, the first and second groove series, and thus the first and second channel series, are formed in precise lateral alignment with one another by the steps of forming the first series of subassembly grooves, creating visible reflections of end portions of the formed grooves, using the reflections as line-of-sight guides to position groove forming means, such as a precision dicing saw, along the second side of the subassembly in precise alignment with various ones of the previously formed first series of grooves, and then using the groove forming means to form the second series of grooves in precise lateral alignment with the first series of grooves.

In a preferred embodiment of the fabrication method of the present invention, this groove alignment portion of the overall method is performed by forming the first series of subassembly grooves, positioning the subassembly in a support fixture having mirrors incorporated therein and positioned to create the aforementioned groove end reflections, and then aligning the groove forming means with the reflections and using the aligned groove forming means to form the second series of subassembly grooves.

DETAILED DESCRIPTION

Figure 1:
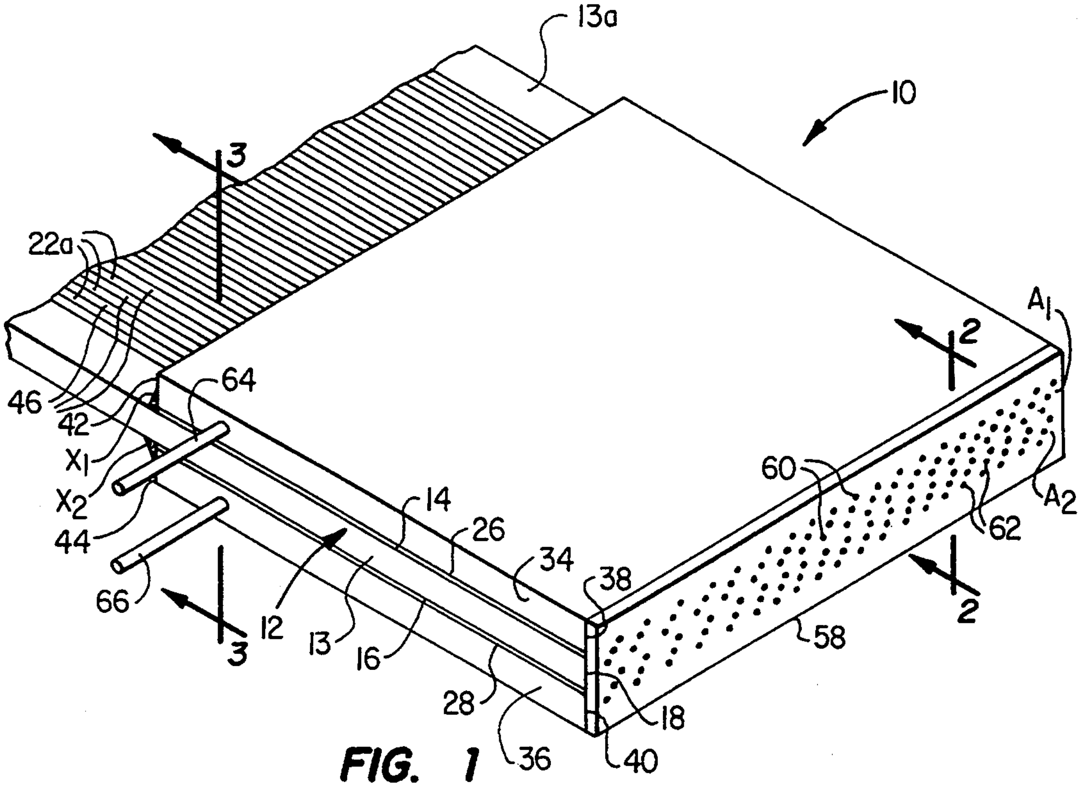
FIG. 1 is a somewhat simplified perspective view of a high orifice density ink jet printhead produced by a unique fabrication method embodying principles of the present invention.
Figure 2:
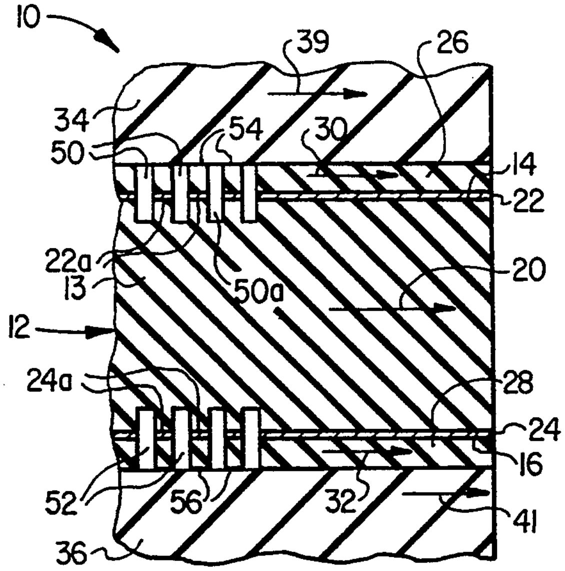
FIG. 2 is an enlarged scale cross-sectional view through a portion of the printhead taken along line 2—2 of FIG. 1.

Illustrated in FIGS. 1 and 2 is an improved ink jet printhead 10 constructed using a unique fabrication method embodying principles of the present invention and subsequently described herein. Printhead 10 includes an elongated rectangular central body section 12 comprising a main block portion 13 representatively formed from a piezoceramic material commonly referred to as "PZT". Main block 13 has a top side 14, a bottom side 16, and a front end 18, and is representatively polled in a rightward direction as indicated by the arrow 20.

Thin layers 22,24 of a metallic material are respectively applied to the top and bottom sides 14,16 of the central body portion 12, and relatively thin rectangular sheets of PZT 26 and 28 are respectively secured to the outer side surfaces of front portions of the metallic layers 22 and 24. PZT sheets 26 and 28 are polled in a rightward direction as indicated by the arrows 30,32 in FIG. 2.

Respectively secured to the outer sides of the sheets 26 and 28 are top and bottom rectangular blocks of PZT 34 and 36. Blocks 34 and 36 are laterally aligned with the main PZT block 13 sandwiched therebetween, have front ends 38 and 40 which are aligned with the front end of the main block 13, are rightwardly polled as indicated by the arrows 39 and 41 in FIG. 2, and have rear ends 42 and 44 that are aligned with one another and stop short of the rear end of the central block 13. Accordingly, as best illustrated in FIG. 1, a portion **13*a* of the main PZT block 13 extends rearwardly beyond the top and bottom blocks 34 and 36**.

Figure 3:
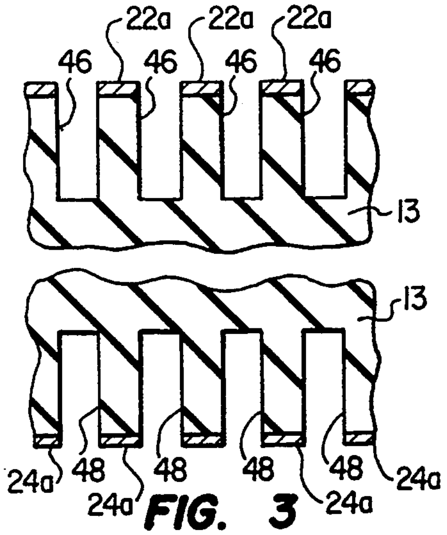
FIG. 3 is a further enlarged scale cross-sectional view through a portion of the printhead taken along line 3—3 of FIG. 1.

Prior to the attachment of the top and bottom blocks 34 and 36 to the PZT sheets 26 and 28, spaced series of grooves 46 and 48 (see FIG. 3) are respectively formed in the top and bottom sides of the central block 13, through the metallic layers 22,24 and the PZT sheets 26,28 thereon, in a unique manner subsequently described herein. Grooves 46 and 46 are precisely aligned with the grooves 48, and both sets of grooves 46,48 longitudinally extend from the front end of the central block 13 to its rear end. After the formation of the grooves 46 and 48, elongated segments **22*a* of the top metal layer 22 are interdigitated with the grooves 46, and elongated segments 24*a* of the bottom metal layer 24 are interdigitated with the grooves 48. As will be seen, in the completed printhead 10 these metal layer segments 22*a*,24*a*** are used as electrical leads through which control signals are transmitted to cause the operative piezoelectric deflection of internal portions of the printhead body.

After the top and bottom PZT blocks 34 and 36 are secured to the PZT sheets 26 and 28 they respectively cover the open sides of front portions of the grooves 46 and 48 to thereby form within the printhead 10 a top series of interior ink receiving channels 50 and a bottom series of interior ink receiving channels 52. The channels 50,52 are appropriately sealed off, as at $X_1$ and $X_2$ (see FIG. 1), at the rear ends of the top and bottom PZT blocks 34 and 36.

Along their lengths the channels 50 are laterally bounded by opposing pairs of interior side walls 54 (see FIG. 2) each having in a vertically intermediate portion thereof one of the metallic segments **22*a*. In a similar manner, along their lengths the channels 52 are laterally bounded by opposing pairs of interior side walls 56 each having in a vertically intermediate portion thereof one of the metallic segments 24*a***.

A horizontally elongated rectangular orifice plate member 58 (see FIG. 1) is suitably secured to the front ends 18,38 and 40 of the PZT blocks 13, 34 and 36, and has horizontally extending top and bottom arrays $A_1$ and $A_2$ of small diameter orifices 60 and 62 formed therethrough. Each of the orifices 60 is communicated with a different one of the top channels 50 (see FIG. 2), and each of the orifices 62 is communicated with a different one of the bottom channels 52. Ink manifolds (not shown) are interiorly formed within rear end portions of the top and bottom PZT blocks 34 and 36 and are supplied with ink from a suitable source thereof (not shown) via exterior ink supply conduits 64 and 66.

During operation of the printhead 10 ink disposed within the interior channels 50,52 may be discharged through selected ones of their associated orifices 60,62 by transmitting electrical driving signals from an appropriate controller (not shown) through the metallic lead segments **22*a*,24*a*** to piezoelectrically deflect the interior side walls of the channels communicating with the selected orifices to cause the forward discharge of ink outwardly through the selected orifices.

For example, if it is desired to discharge ink in droplet form from the orifice 60 associated with the top channel 50*a* shown in FIG. 2, appropriate electrical driving signals are transmitted through the pair of metallic lead segments 22*a* within the opposing interior side walls 54 that laterally bound the channel 50*a*. These driving signals are first used to piezoelectrically deflect the bounding pair of side walls 54 outwardly away from the selected channel 50*a*, and then reversed to piezoelectrically deflect the bounding pair of side walls 54 into the selected channel 50*a* to increase the ink pressure therein and responsively force a droplet of ink outwardly through the associated orifice 60. In a similar manner, electrical driving signals may be transmitted through associated pairs of the bottom metallic lead segments 24*a* to force ink, in droplet form, outwardly from a selected bottom channel 52 through its associated orifice 62.

As will readily be appreciated by those skilled in this art, compared to a conventionally configured ink jet printhead assembly having only a single channel array in its main piezoelectric block portion, the illustrated ink jet printhead 10 advantageously provides a substantially higher discharge orifice density due to the fact that two aligned channel arrays are formed on opposite sides of the central printhead body portion defined by the main piezoelectric block 13, the metallic layers 22 and 24, and the opposite side sheets of piezoelectric material 26 and 28. The provision of these dual channel series in this manner substantially reduces the overall size of the printhead required to create this substantially increased orifice density.

As previously stated herein, the top series of channels 50 is very precisely aligned, in a lateral sense, with the bottom series of channels 52. This precise channel array alignment is achieved in the present invention using a unique method which will now be described in conjunction with FIGS. 4 and 5.

Figure 5:
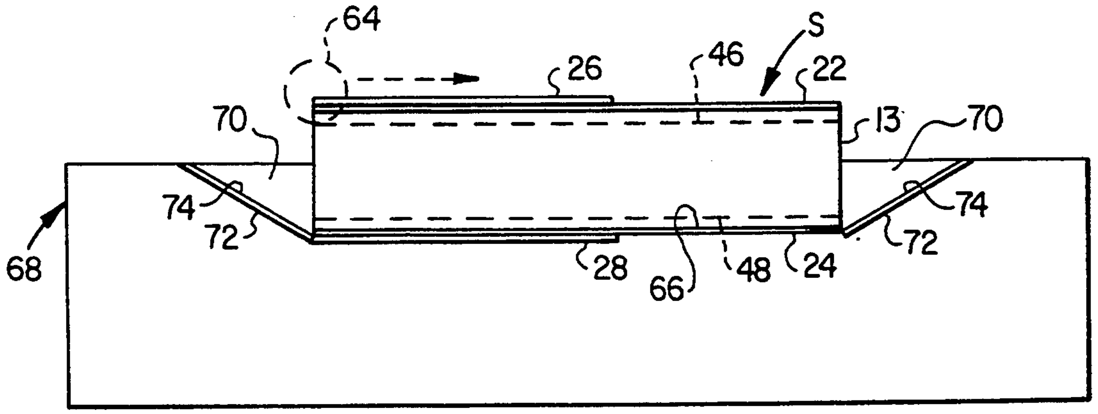

After the metallic layers 22 and 24 have been placed on the top and bottom sides of the main PZT block 13, and the top and bottom PZT sheets 26 and 28 are secured to the metallic layers 22 and 24, a printhead subassembly S is formed. Groove forming means, such as the precision dicing saw 64 schematically depicted in FIG. 5, are then used to form one of the series of grooves 46 and 48, for example the bottom side series of grooves 48, in the subassembly S. The partially grooved subassembly S is then placed bottom side down in a complementarily configured rectangular top side pocket area 66 of a specially designed optical alignment and support fixture 68.

Central web portions 70 of the fixture 68 bear against the front and rear end portions of the inserted printhead subassembly S and are each flanked by a pair of downwardly and inwardly sloped indented surface portions 72 of the fixture 68. Inner sides of four rectangular mirrors 74 are suitably affixed to the indented surfaces 72.

Figure 4:
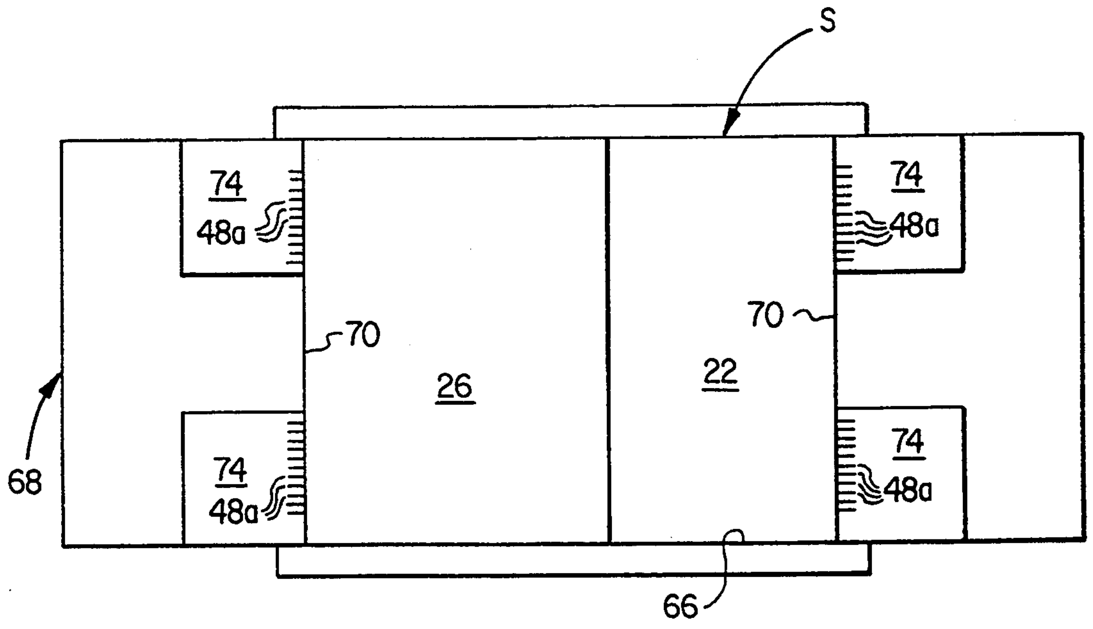
FIGS. 4 and 5, respectively, are top plan and side elevational views of a central body portion of the printhead and illustrate an optical alignment fixture used in the formation of precisely aligned grooves disposed on opposite sides of such central body portion and forming portions of the interior ink receiving channels of the finished ink jet printhead cross-sectionally illustrated in FIG. 2.

As best illustrated in FIG. 4, end portions of the previously formed bottom side grooves 48 create reflections 48*a* in the mirrors 74. These groove end reflections 48*a*, as viewed from above, are then used as line-of-sight guides to position the dicing saw 64 (or other groove forming means such as a laser beam) for use in forming the top side grooves 46 as schematically illustrated in FIG. 5. Because the saw 64 is precisely aligned with front and rear end reflections 48*a* of various ones of the bottom side grooves 48, the finished series of top side grooves 46 are very precisely aligned with the previously formed bottom side grooves 48.

After the top side grooves 46 are formed, the subassembly S is removed from the fixture 68 and the remaining components of the ink jet printhead 10 are appropriately secured to the subassembly 10 as previously described herein to form the high orifice density printhead of the present invention.

The foregoing detailed description is to be clearly understood as being given by way of illustration and example only, the spirit and scope of the present invention being limited solely by the appended claims.

What is claimed is:

1. A method of fabricating a high discharge orifice density ink jet printhead, said method comprising the steps of:

constructing a printhead body subassembly by providing a first piezoelectrically deflectable block structure having first and second opposite sides and a front end, respectively securing first and second layers of a metallic material to said first and second sides, and respectively securing first and second sheets of a piezoelectrically deflectable material to front end portions of the outer sides of said first and second layers of metallic material;

forming a first spaced series of elongated, parallel exterior surface grooves in said subassembly, said first series of grooves laterally extending into said first side of said first block structure through said first piezoelectric sheet and said first metallic layer, said first series of grooves having open outer sides and open front ends;

forming a second series of elongated, parallel exterior surface grooves in said subassembly, said second series of grooves laterally extending into said second side of said first block structure through said second piezoelectric sheet and said second metallic layer, said second series of grooves having open outer sides and open front ends and being in precise lateral alignment with said first series of grooves;

securing a second piezoelectric block to the outer side of said first piezoelectric sheet in a manner covering front longitudinal portions of said open sides of said first series of grooves to form therewith a first series of ink receiving channels laterally bounded along their lengths, on opposite sides thereof, by a first spaced series of piezoelectrically deflectable side wall segments of said subassembly;

securing a third piezoelectric block to the outer side of said second piezoelectric sheet in a manner covering front longitudinal portions of said open sides of said first series of grooves to form therewith a second series of ink receiving channels laterally bounded along their lengths, on opposite sides thereof, by a second spaced series of piezoelectrically deflectable side wall segments of said subassembly;

covering the open front ends of said first and second series of ink receiving channels with an orifice plate member having a first spaced series of ink discharge orifices formed therein and operatively communicated with the front ends of said first series of ink receiving channels, and a second spaced series of ink discharge orifices formed therein and operatively communicated with the front ends of said second series of ink receiving channels;

sealing off rear end portions of said first and second series of ink receiving channels; and providing means for flowing ink into said first and second series of ink receiving channels.

2. The method of claim 1 wherein:

said step of providing a first piezoelectrically deflectable block structure is performed by providing a unitary block of piezoelectrically deflectable material.

3. The method of claim 1 wherein said first and second series of grooves are precisely aligned with one another by the steps of:

forming said first series of grooves in said subassembly, creating visible reflections of opposite end portions of said first series of grooves, and using said reflections as line-of-sight guides, during the formation of said second series of grooves, to position said second series of grooves in precise lateral alignment with said first series of grooves.

4. The method of claim 3 wherein:

said step of creating visible reflections of opposite end portions of said first series of grooves is performed using mirror structures positioned adjacent opposite end portions of said first series of grooves.

5. The method of claim 4 wherein:

said steps of forming said first and second series of grooves are performed using a precision dicing saw.

6. The method of claim 4 wherein:

said step of forming said second series of grooves is performed by placing said subassembly, after the formation therein of said first series of grooves, in a support fixture, and said mirror structures are incorporated in said support fixture.

* * * * *